United States Patent
Kostylev et al.

(10) Patent No.: US 7,327,602 B2
(45) Date of Patent: Feb. 5, 2008

(54) METHODS OF ACCELERATED LIFE TESTING OF PROGRAMMABLE RESISTANCE MEMORY ELEMENTS

(75) Inventors: Sergey A. Kostylev, Bloomfield Hills, MI (US); Tyler Lowrey, San Jose, CA (US); Wolodymyr Czubatyj, Warren, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 10/960,263

(22) Filed: Oct. 7, 2004

(65) Prior Publication Data

US 2006/0077705 A1 Apr. 13, 2006

(51) Int. Cl.
*G11C 11/00* (2006.01)
(52) U.S. Cl. ............. 365/163; 365/185.03; 365/185.19
(58) Field of Classification Search ................ 365/163, 365/185.03, 185.19, 185.12, 105
See application file for complete search history.

(56) References Cited

U.S. PATENT DOCUMENTS

| | | | | |
|---|---|---|---|---|
| 3,922,648 A | * | 11/1975 | Buckley | ................... 365/163 |
| 4,228,524 A | * | 10/1980 | Neale et al. | ................ 365/163 |
| 5,912,839 A | * | 6/1999 | Ovshinsky et al. | .... 365/185.03 |
| 6,862,214 B2 | * | 3/2005 | Lee et al. | .................. 365/163 |
| 7,110,286 B2 | * | 9/2006 | Choi et al. | .................. 365/163 |
| 7,116,593 B2 | * | 10/2006 | Hanzawa et al. | ........... 365/203 |
| 7,136,299 B2 | * | 11/2006 | Chu et al. | .................. 365/163 |
| 2003/0002332 A1 | * | 1/2003 | Lowrey | ..................... 365/163 |
| 2005/0117387 A1 | * | 6/2005 | Hwang et al. | .............. 365/163 |
| 2005/0201182 A1 | * | 9/2005 | Osada et al. | ........... 365/230.03 |

* cited by examiner

*Primary Examiner*—Tuan T. Nguyen
*Assistant Examiner*—Dang Nguyen
(74) *Attorney, Agent, or Firm*—Kevin L. Bray; Marvin S. Siskind

(57) ABSTRACT

A method of testing a programmable resistance memory element. The method includes applying a plurality of reset pulses to the memory element. Each of the reset pulses having an energy which is greater than the minimum energy needed to program the memory element from its set state to its reset state.

21 Claims, 7 Drawing Sheets

METHODS OF ACCELERATED LIFE TESTING OF PROGRAMMABLE RESISTANCE MEMORY ELEMENTS

FIELD OF THE INVENTION

The present invention relates generally to programmable resistance memory elements. More specifically, the present invention relates to methods of testing electrically programmable, programmable resistance memory elements.

BACKGROUND OF THE INVENTION

Programmable resistance memory elements formed from materials that can be programmed to exhibit at least a high or low stable ohmic state are known in the art. Such programmable resistance elements may be programmed to a high resistance state to store, for example, a logic ONE data bit or programmed to a low resistance state to store a logic ZERO data bit.

The use of electrically programmable phase-change materials (for example, materials which can be electrically programmed between amorphous and crystalline states) for electronic memory applications is well known in the art and is disclosed, for example, in commonly assigned U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Still another example of a phase-change memory element is provided in commonly assigned U.S. patent application Ser. No. 09/276,273, the disclosure of which is incorporated by reference herein.

Generally, phase-change materials are capable of being electrically programmed between a first structural state where the material is generally amorphous and a second structural state where the material is generally crystalline. The term "amorphous", as used herein, refers to a condition which is relatively structurally less ordered or more disordered than a single crystal. The term "crystalline", as used herein, refers to a condition which is relatively structurally more ordered than amorphous. The phase-change material exhibits different electrical characteristics depending upon its state. For instance, in its crystalline, more ordered state the material exhibits a lower electrical resistivity than in its amorphous, less ordered state.

Materials that may be used as a phase-change material include alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy is the alloy $Ge_2Sb_2Te_5$.

SUMMARY OF THE INVENTION

One aspect of the present invention is a method of operating an electrically programmable, phase-change memory element, the memory element having at least a low resistance state and a high resistance state, the method comprising: providing the memory element; and applying a plurality of first-type pulses of energy to the memory element, each of the first-type pulses being sufficient to program the memory element from the low resistance state to the high resistance state, each of the first-type pulses having an energy which is greater than the minimum energy needed to program the memory element from the low resistance state to the high resistance state.

Another aspect of the present invention is a method of operating an electrically programmable, phase-change memory element, the memory element having at least a low resistance state and a high resistance state, the method comprising: providing the memory element; and applying a plurality of energy cycles to the memory element, each of the cycles comprising a first-type pulse of energy followed by a second-type pulse of energy, the first-type pulse being sufficient to program the memory element from the low resistance state to the high resistance state, the first-type pulse having an energy which is greater than the minimum energy needed to program the memory element from the low resistance state to the high resistance, the second-type pulse being sufficient to program the memory element from the high resistance state to the low resistance state.

Another aspect of the present invention is a method of operating an electrically programmable, phase-change memory element, the memory element having at least a low resistance state and a high resistance state, the method comprising: providing the memory element; and applying a plurality of energy pulses to the memory element, each of the energy pulses being sufficient to program the memory element from the high resistance state to the low resistance state, each of the energy pulses having an energy which is greater than the minimum energy needed to program the memory element from the high resistance state to the low resistance state.

Another aspect of the present invention is a method of operating a programmable resistance memory element, the memory element having at least a set state and a reset state, the method comprising: providing the programmable resistance memory element; and applying a plurality of reset pulses to the memory element, each of the reset pulses having an energy which is greater than the minimum energy needed to program the memory element from the set state to the reset state.

Another aspect of the present invention is a method of operating a programmable resistance memory element, the memory element having at least a set state and a reset state, the method comprising: providing the programmable resistance memory element; and applying a plurality of energy cycles to the memory element, each of the cycles comprising a reset pulse followed by a set pulse, the reset pulse having an energy which is greater than the minimum energy needed to program the memory element from the set state to the reset state.

Another aspect of the present invention is a method of operating a programmable resistance memory element, the memory element having at least a set state and a reset state, the method comprising: providing the memory element; and applying a plurality of set pulses to the memory element, each of the set pulses having an energy which is greater than the minimum energy needed to program the memory element from the reset state to the set state.

DETAILED DESCRIPTION OF THE INVENTION

Figure 1:
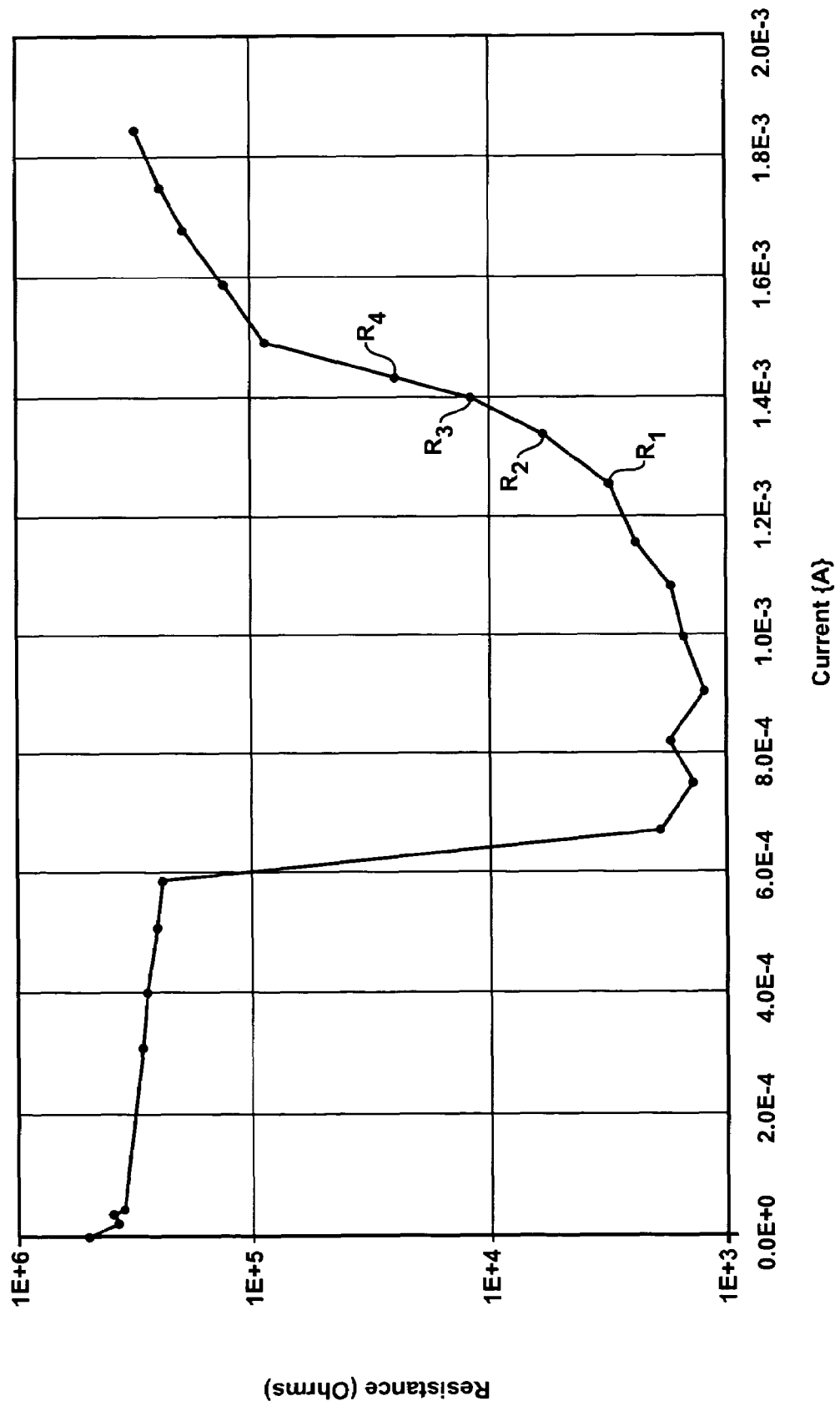
FIG. 1 is an example of a resistance curve of a chalcogenide-based phase-change memory element.

FIG. 1 is a plot of the resistance of a chalcogenide phase-change memory element versus the amplitude of a current pulse through the memory element. Referring to left side of the curve in FIG. 1, the resistance of the device remains substantially constant (i.e., in its high resistance or reset state) until a current pulse of sufficient energy is applied. The device is then transformed from its high resistance state to its low resistance or set state. A pulse of energy (such as electrical energy) sufficient to program the memory element from the high resistance or reset state to the low resistance or set state is referred to as a set pulse. While not wishing to be bound by theory, it is believed that the set pulse is sufficient to change at least a portion of the volume of memory material from a less-ordered amorphous state to a more-ordered crystalline state. Preferably, the set pulse is a pulse of electrical energy such as a current pulse. Electrical energy may be electron-beam energy. It is conceivable that other forms of energy such as optical energy, mechanical energy or thermal energy be used.

The memory device may be programmed back from the low resistance state or set state to the high resistance or reset state. A pulse of energy (such as electrical energy) sufficient to program the memory element from the low resistance or set state to the high resistance or reset state is referred to as a reset pulse. While not wishing to be bound by theory, it is believed that application of a reset pulse to the memory element is sufficient to change at least a portion of the volume of memory material from a more-ordered crystalline state to a less-ordered amorphous state. The memory device may be programmed back and forth between the high resistance state and the low resistance state. Preferably, the reset pulse is a pulse of electrical energy such as a current pulse. The electrical energy may be electron-beam energy. It is conceivable that other forms of energy such as optical energy, mechanical energy or thermal energy be used. This type of programming scheme provides for a binary mode of operation.

Referring to the right side of the curve shown in FIG. 1, as the amplitude of the current through the memory element increases, the resistance of the device increases. This increase is both gradual and reversible. In this regime, the phase-change memory element may be programmed to any resistance value within a window of resistance values bounded by the low resistance or set state and the high resistance or reset state. More specifically, in this regime along the right side of the curve, the phase-change memory element may be reversibly programmed from any one of the resistance states on the right side of the resistance curve to any other of the resistance states on the right side of the curve by the application of a current pulse of sufficient amplitude and sufficient width. The device may thus be programmed between three or more resistance values within the resistance window so as to provide for multi-state, directly overwritable data storage. With at least three resistance states, each of the memory elements is capable of storing more than one bit of information. While not wishing to be bound by theory, it is believed that each of the resistance states along the right side of the curve may correspond to a particular ratio of the volume of crystalline material to the volume of amorphous material in an active region of the phase-change material. As a particular example, four intermediate resistance states R1, R2, R3 and R4 are shown in the resistance curve of FIG. 1. In this multi-state type of operation, each of the memory elements is capable of storing two bits of information.

Hence, a memory element may be operated in a binary mode of operation or a multi-state mode of operation. As noted above, a programmable resistance memory element may be cycled in the binary mode between a low resistance or set state and a high resistance or reset state when proper current pulses are applied. After some time of cycling, or total accumulated cycles, devices may fail to operate properly. Several failure modes have been observed:

(1) Stuck Reset

The memory device loses the ability to the low resistance or SET state and stays in the high resistance or reset state for all values of set current pulse amplitude and width. This is known as "stuck reset" condition. The device inability to program to the SET state from a stuck reset state may be caused by changes in the chalcogenide material due to migration effects resulting in the chalcogenide material's temporarily loss of ability to crystallize. Though electronic switching may occur whereby the device switches from its off state to its on state, there is a loss of the ability to program to the low resistance or set state. Hence, the device switches back to its off state when the current through the device is removed. This failure mode may be seen more often when elevated reset pulse amplitudes and wider pulse widths are being used.

(2) Stuck Set

The memory device loses the ability to be programmed to the high resistance or reset state and stays in the low resistance or set state, for any value of programming current passing through the device. These devices may be shunted or shorted. It is possible that a contact material has migrated through the active region of the chalcogenide, or the chalcogenide material itself has re-arranged itself into a highly conductive region. This condition is known as the "stuck set" condition.

(3) Loss of Contact

The memory device loses contact with the programming source and no current can pass through the device. It is possible that internal stress due to heat cycling causes either contact material to break at the interface with the chalcogenide material or the active chalcogenide material to delaminate from the contact. This results in a loss of ability to pass current through the device and therefore loss of programmability.

(4) Jitter

Partial loss of contact, resulting in erratic behavior, as evidenced by drastic variation of the set or reset state resistance levels as well as device voltages during programming. Thus, programmability might come back, but this type of device is unreliable.

The nature of phase-change media doesn't allow for standard elevated temperature stress-tests. The temperature of these cycle-life tests typically can't exceed about 110° C., which makes cycle-life tests quite lengthy, and this disclosure describes ways of shortening the test procedure.

While not wishing to be bound by theory, it is believed that failure of all programmable resistance memory elements is based on high current density through the memory elements, which results in the deposition of energy in the device. The high current density also causes migration of materials due to, among other reasons, the electron-phonon interactions. The deposited energy causes heat and stress. Due to the inherent long cycle life of the devices, it is beneficial to be able to predict device operation based on accelerated tests not associated with the elevated temperatures.

Figure 2:
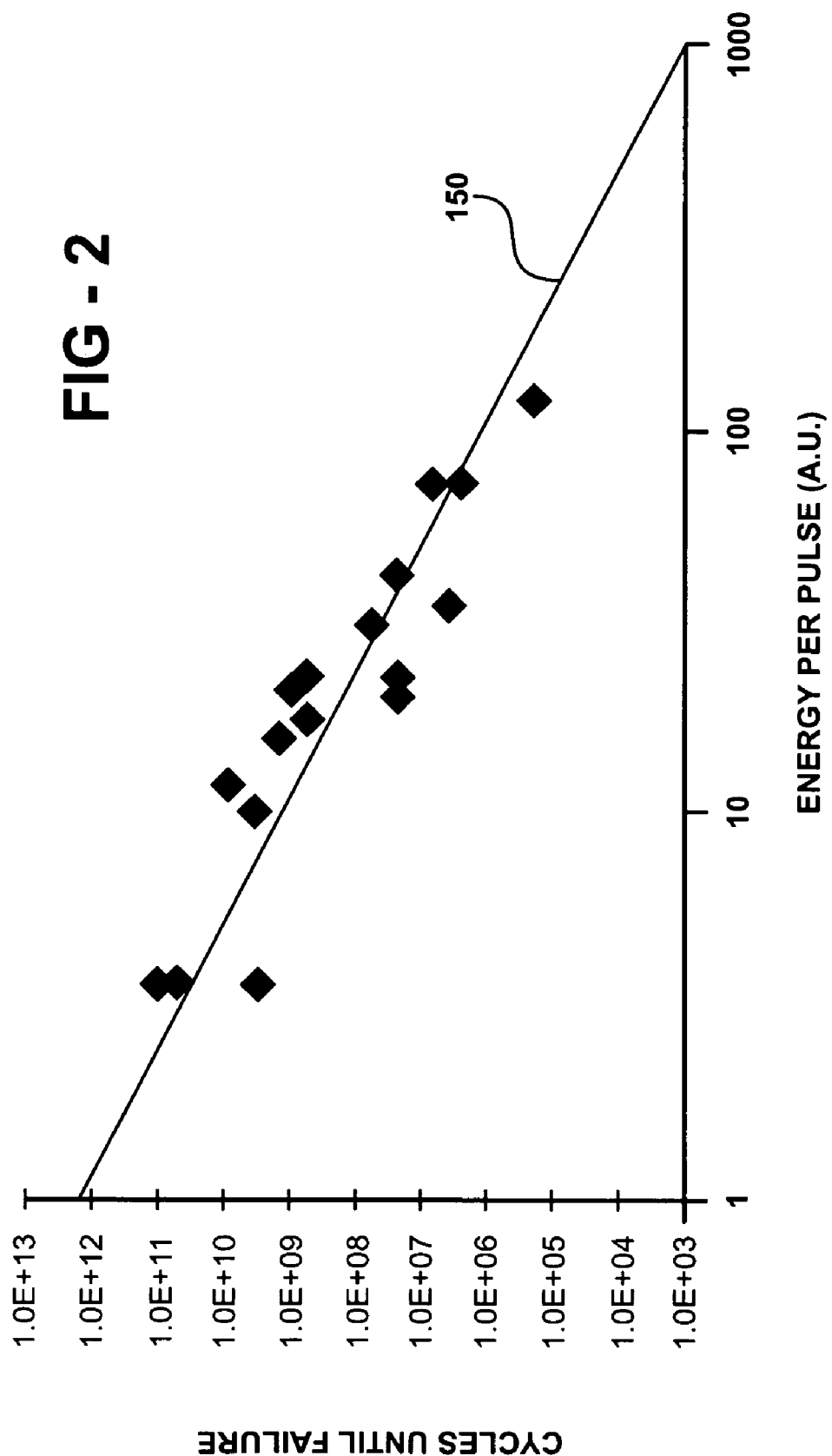
FIG. 2 is a plot showing the cycle life of a memory element versus the energy of the reset pulses applied to the memory element.

The inventors of the present invention have discovered that there is a dependence of cycling capability (cycle life) of the memory element with the energy of the reset pulses applied to the memory element. It has been observed that increasing the energy of the applied reset pulses prematurely ages the memory element and decreases its cycle life. An example of a plot showing the relationship between the cycle life of the memory element and the energy of the reset pulses (in units of A.U.) that are applied to the memory element are shown in FIG. 2. Line 150 is an estimated line that is fit to the plotted data.

High energy reset pulses may thus be applied to the memory element in order to accelerate the aging of the memory element and test it for different types of failures. Application of high energy reset pulses permits accelerated aging of the memory element so that the memory element is made to fail relatively quickly compared to the number of cycles (and time) it would take if tested under more standard operating conditions (e.g. using reset pulses at or near the minimum energy needed to program the memory element from its low resistance state to its high resistance state). Hence, different device materials and structures may be tested and compared relatively quickly.

Figure 3:
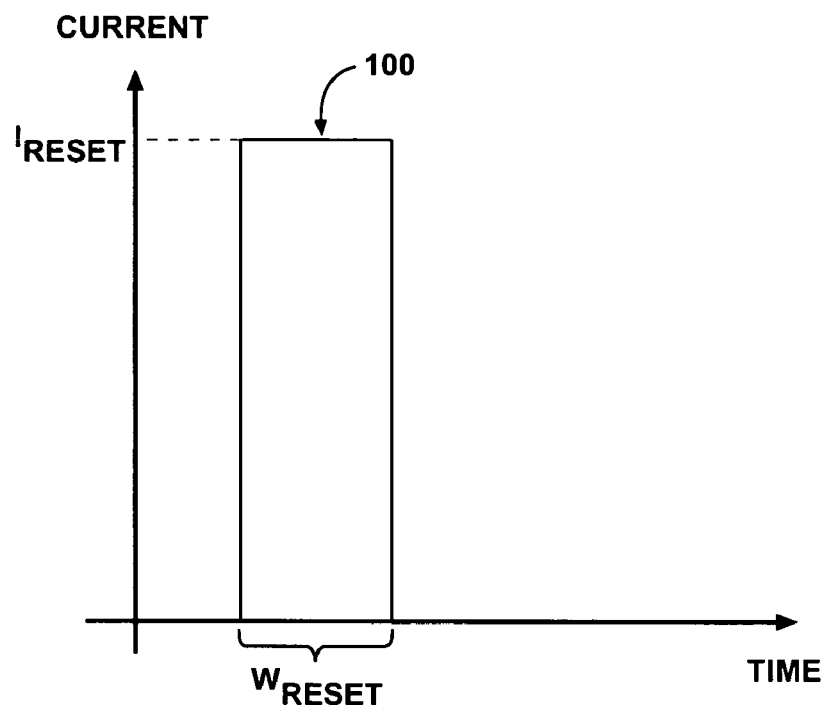
FIG. 3 is an example of a reset pulse.

As noted above, a reset pulse is a pulse of energy (typically a pulse of electrical current) which is capable of transforming a phase-change memory element from its low resistance or set state to its high resistance or reset state. An example of a reset pulse is shown in FIG. 3. Referring to FIG. 3, the reset pulse 100 is a generally rectangular pulse of current having a substantially constant magnitude $I_{RESET}$ and a pulse width of $W_{RESET}$. The magnitude of the reset pulse $I_{RESET}$ should be greater than or equal to a minimum current $I_{MIN}$ that must be applied to the memory element in order to bring the phase change material to its melting temperature (the amorphizing temperature) $T_M$. In addition, in order to bring the phase-change material to its melting or amorphizing temperature $T_M$, this minimum current $I_{MIN}$ should be applied to the memory element for a minimum period of time $W_{MIN}$. Hence, a reset pulse must have a minimum energy $E_{MIN}$ that must be applied to the memory element in order to bring the phase-change material to its melting temperature so that the memory element can be programmed from its low resistance or set state to its high resistance or reset state.

A used herein a "hard" reset pulse is also a reset pulse that is capable of transforming the memory element from its set state to its reset state. However, the hard reset pulse has an energy which is greater than the minimum energy $E_{MIN}$ needed to for this transformation to occur. The deposited energy of the reset pulse is directly proportional to the product of amplitude of the pulse multiplied by the width of the pulse. Hence, the energy of the pulse may be increased by increasing the amplitude and/or the width of the pulse.

Figure 4A:
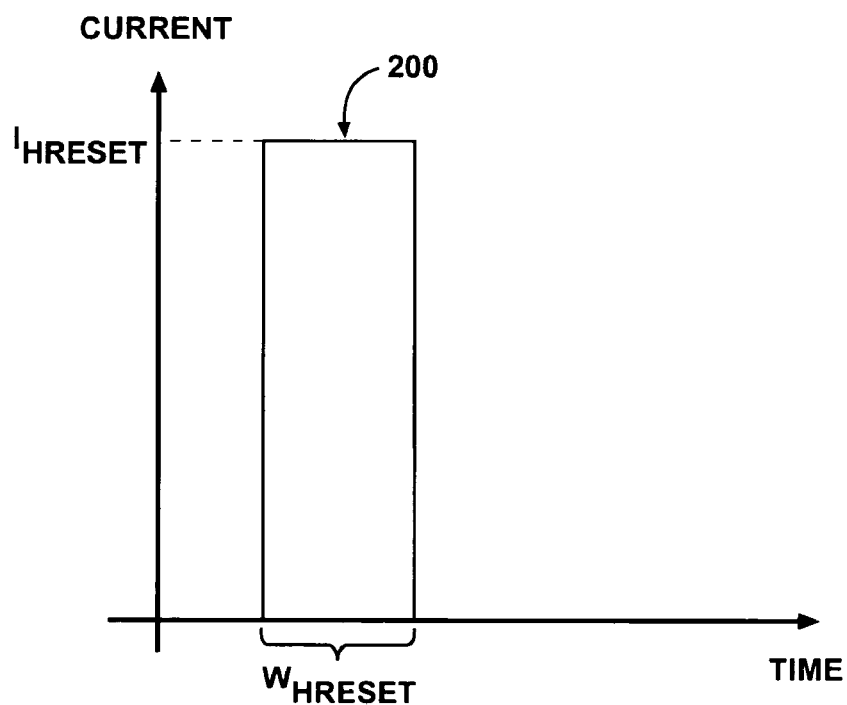
FIG. 4A is an example of a hard reset pulse.

An example of a hard reset pulse is shown in FIG. 4A as hard reset pulse 200. The hard reset pulse has an amplitude of $I_{HRESET}$ and a width of $W_{HRESET}$. As noted, the energy of the hard reset pulse 200 is greater than the minimum energy needed to program the memory element from its low resistance or set state to its high resistance or reset state. Hence, the hard reset pulse may be formed by (1) making the magnitude of the pulse $I_{HRESET}$ greater than $I_{MIN}$ while keeping the time period of the pulse $W_{HRESET}$ equal to $W_{MIN}$, (2) keeping the magnitude of the pulse equal to $I_{MIN}$ while making the time period of the pulse greater than $W_{MIN}$, or (3) making the magnitude of the pulse greater than $I_{MIN}$ and by making the time period of the pulse greater than $W_{MIN}$. While hard reset pulses preferably have a generally rectangular shape, other shapes (such as generally triangular shapes) are also possible.

Test Method 1

A memory element may thus be tested by applying a plurality of hard reset pulses to the memory element. Preferably, the plurality of hard reset pulses are applied consecutively (as a sequence of pulses). Generally, the hard reset pulses do not have to be identical. However, it one embodiment of the invention, all of the hard reset pulses are identical.

Figure 4B:
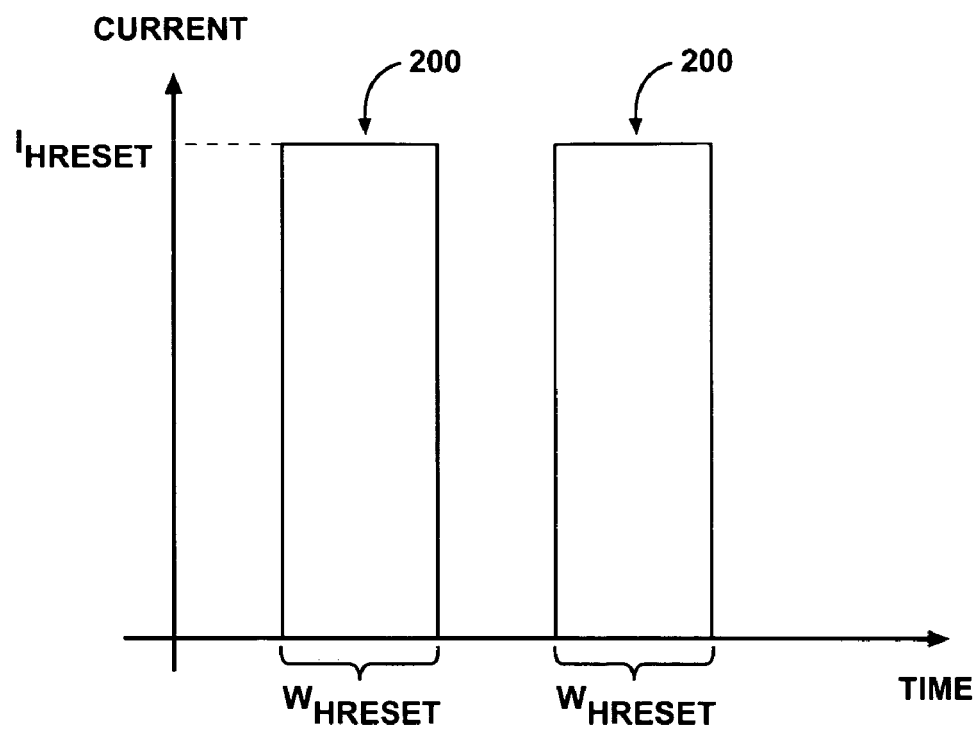
FIG. 4B shows two consecutive hard reset pulses.

An example of such a sequence of hard reset pulses is shown in FIG. 4B that shows two hard reset pulses 200. Each of the hard reset pulses 200 has an amplitude $I_{HRESET}$ as well as a width of $W_{HRESET}$. Each of the hard reset pulses 200 is capable of programming the memory element from its low resistance or set state to its high resistance or reset state. In addition, each of the hard reset pulses 200 has an energy which is greater than the minimum energy $E_{MIN}$ needed to program the memory element from its low resistance or set state to its high resistance or reset state. The hard reset pulses are applied until the memory element fails. Failure is detected by periodically measuring the resistance of the memory element. For example, the memory device may lose its ability to reset and become (and remain) conducting regardless of the programming current passing through the device. Hence, this test is especially appropriate for detecting the "stuck set" problem that was discussed above.

Using the same testing procedure, programmable resistance memory elements having various structures and/or made with different materials may be tested and compared.

Alternately, the same testing procedure may be applied repeatedly to a plurality of similar memory devices. The energy of the applied reset pulses may be increased for each device. A plot similar to the one shown in FIG. 2 (Cycles Unit Failure vs Energy per Pulse) may thus be created. The plot may be extrapolated by the intersection of the line 150 with the vertical axis provides an estimation of the cycle life of the memory element when the energy of the reset pulse is $E_{MIN}$.

Test Method 2

In this case, a memory element is tested by applying a plurality of energy cycles to the memory element. Each of the energy cycles includes a hard reset pulse followed by a set pulse. The hard reset pulse has an energy which is greater than the minimum energy needed to program the memory element from its set state to its reset state. The set pulse may be any pulse sufficient to program the memory element from its high resistance or reset state back to its low resistance or set state. The energy cycles are preferably electrical energy such as current cycles. Generally, the plurality of cycles do not have to be identical. However, in one embodiment of the invention, all of the cycles are identical.

Figure 5A:
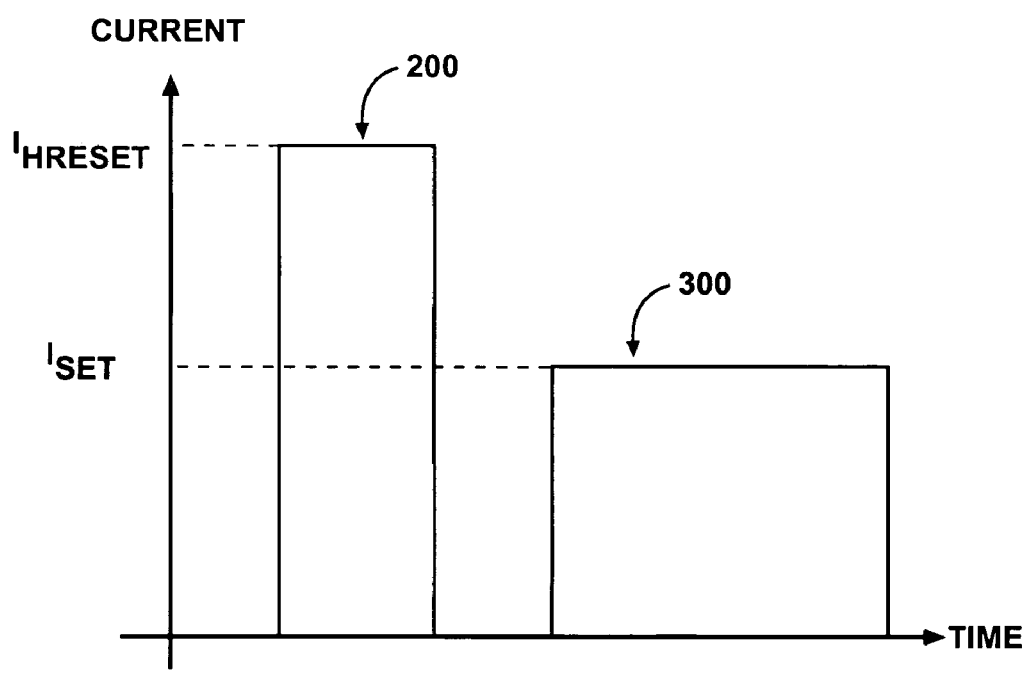
FIG. 5A shows an electrical cycle comprising a hard reset pulse followed by a set pulse having a generally rectangular shape.
Figure 5B:
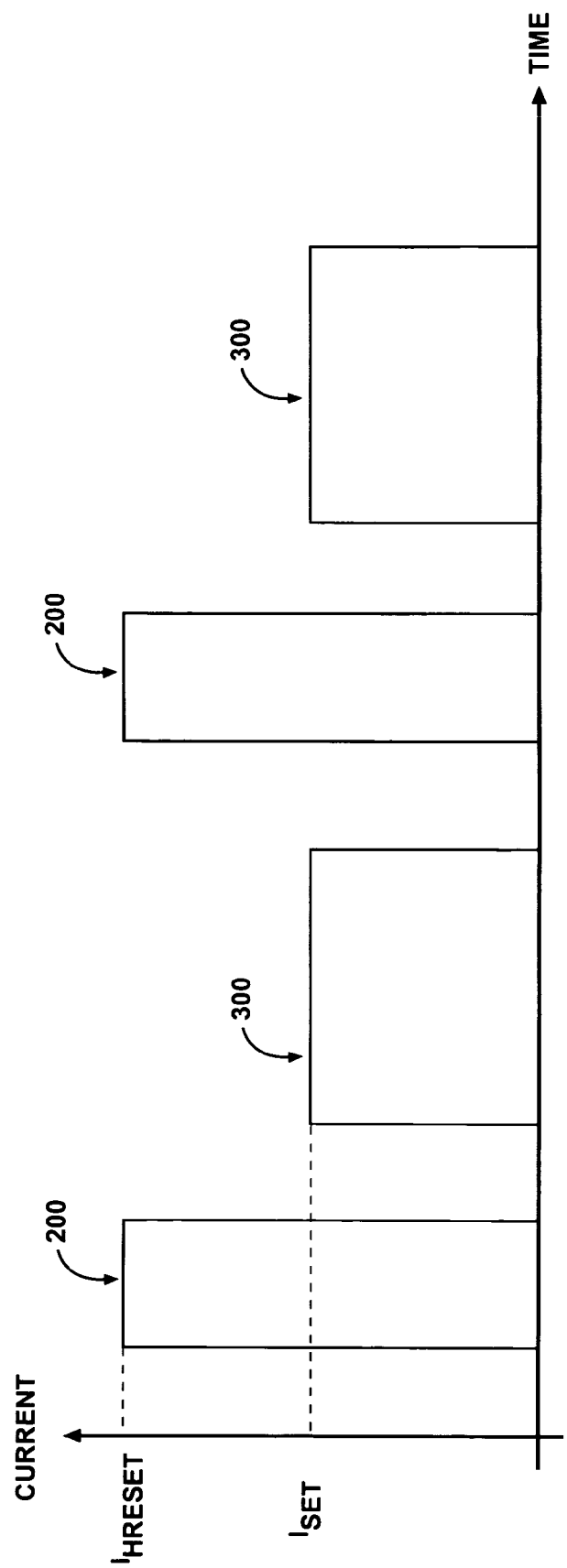
FIG. 5B shows two consecutive electrical cycles from FIG. 5A.

An example of this process is shown in FIGS. 5A and 5B. FIG. 5A shows the hard reset pulse 200 followed by the set pulse 300. In the example shown, the set pulse 300 is a generally rectangular pulse having a substantially constant amplitude of $I_{SET}$. The magnitude of $I_{SET}$ is preferably chosen less than $I_{RESET}$. In addition, the magnitude of $I_{SET}$ is preferably chosen to heat the programmable resistance material to an optimum temperature $T_{OPT}$ which is lower than the melting temperature $T_M$. The temperature $T_{OPT}$ is that which allows the material in the cell to be crystallized in a relatively short time interval and yielding a relatively low resistance. Hence, the magnitude of the set pulse 300 is preferably chosen to small enough to prevent the programmable resistance material from reaching the amorphizing temperature, but large enough to cause the material to reach $T_{OPT}$ so that the material can crystallize. FIG. 5B shows two consecutive electrical cycles where each electrical cycle includes the hard reset pulse 200 followed by the set pulse 300.

As noted, FIGS. 5A and 5B show the set pulse 300 which is generally rectangular is shape. However, other shapes are also possible. For example, the set pulses may have a generally triangular shape. Set pulses having generally triangular shapes are described in U.S. Pat. No. 6,570,784. U.S. Pat. No. 6,570,784 is hereby incorporated by reference herein.

Figure 6A:
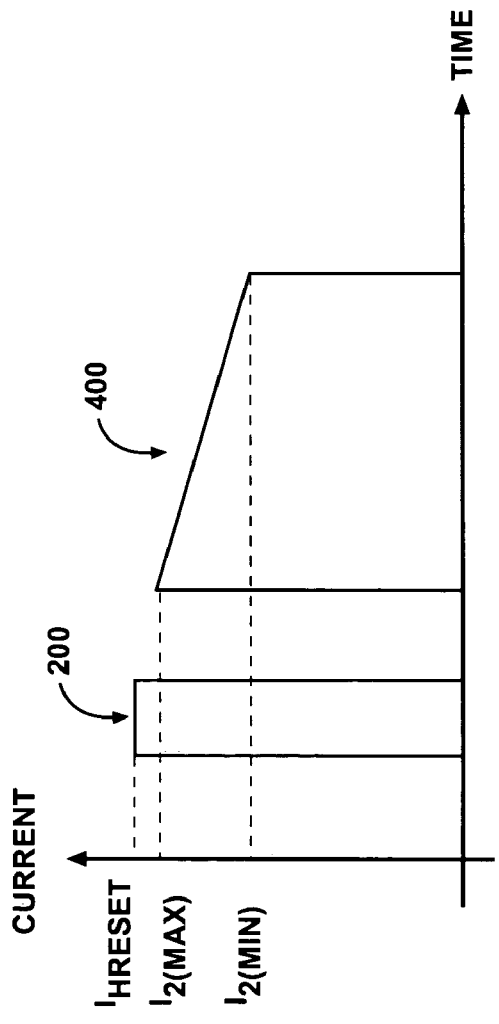
FIG. 6A shows an electrical cycle comprising a hard reset pulse followed by a set pulse having a generally triangular shape.
Figure 6B:
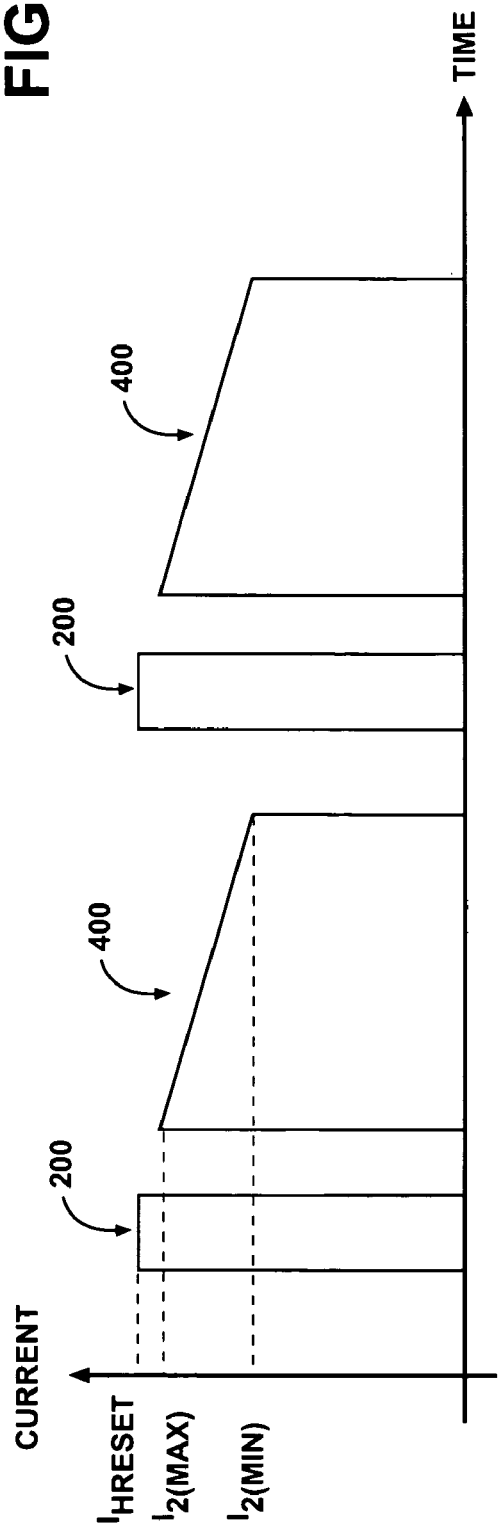
FIG. 6B shows two consecutive electrical cycles from FIG. 6A.

An example of a generally triangular set pulse is shown as set pulse 400 in FIG. 6A. FIG. 6A shows an electrical cycle that includes a hard reset pulse 200 followed by a generally triangular set pulse 400. The set pulse 400 has a leading portion that peaks at the magnitude or maximum, $I_{2(MAX)}$, and a trailing portion that decays to a minimum value $I_{2(MIN)}$. The leading portion may have a much greater slope than the tailing portion. The shaping of the set pulse involves setting a number of parameters that include the maximum and minimum values, and the decay rate/pulse width, in view of the structure and type of the phase-change material used, as well as the operating thermal environment of the memory devices. The levels of $I_{2(MAX)}$ and $I_{2(MIN)}$ may assume a wide range of values. For example, $I_{2(MAX)}$ may be substantially greater than $I_{RESET}$ or it may be substantially smaller so long as the pulse width is long enough to insure that the phase-change material in the cells in which the pulse is applied crystallize. Hence, the level of $I_{2(MAX)}$ may be such that the programmable resistance material may reach the melting temperature. However, the slope of the downward sloping trailing portion is such that even those cells that reach the melting temperature will have a chance to cool down to and crystallize at or near $T_{OPT}$. Crystallization is a function of both the temperature and the amount of time the material spends at that temperature. The level of $I_{2(MIN)}$ may also vary over a wide range of values including as low as zero. FIG. 6B shows two consecutive electrical cycles where each cycle include hard reset pulse 200 followed by set pulse 400.

Figure 7A:
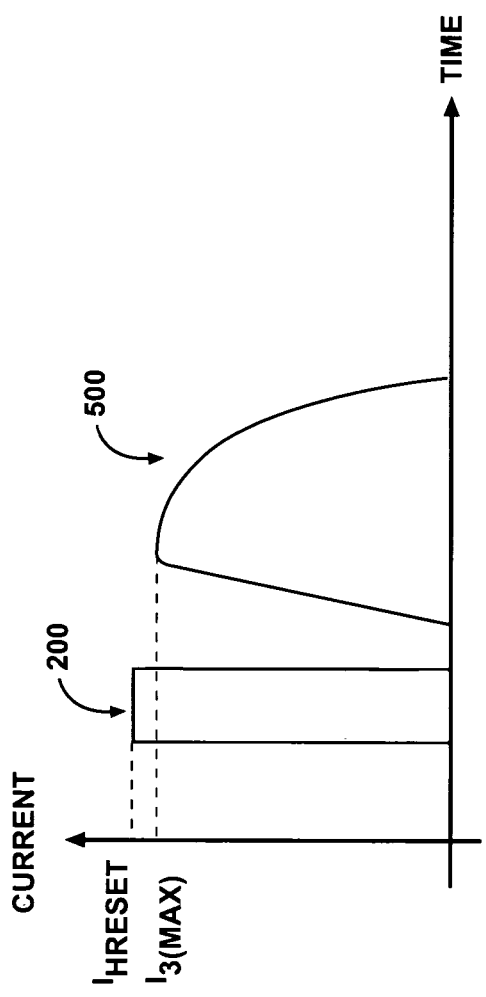
FIG. 7A shows an electrical cycle comprising a hard reset pulse followed by a set pulse having a generally triangular shape where the triangular shape has a leading portion, a flat portion and a trailing portion.
Figure 7B:
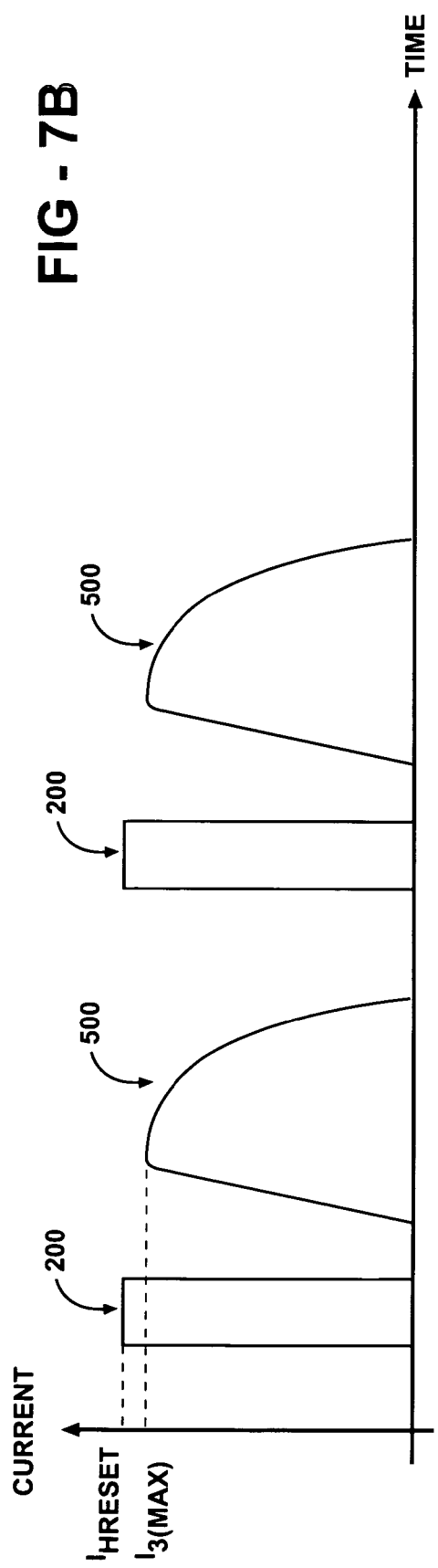
FIG. 7B shows two consecutive electrical cycles from FIG. 7A.

FIG. 7A depicts another example of an electrical cycle that includes a hard reset pulse 200 followed by a set pulse 500. In this example, the set pulse 500 is also generally triangularly shaped. The set pulse 500 has an energy which is sufficient to program the memory element from its high resistance or reset state to its low resistance or set state. The set pulse 500 has a relatively short intermediate portion between the leading and trailing portions, wherein the intermediate portion has essentially zero slope relative to the leading and trailing portions. Also, in contrast to the linear decay rate, the trailing portion has a nonlinear slope. In general, the decay rate in the trailing portion may be a wide range, including polynomial, logarithmic and exponential so long as the trailing portions cause all relevant cells in the device to sweep through a rapid crystallization temperature interval. The levels of $I_{3(MAX)}$ may assume a wide range of values. For example, $I_{3(MAX)}$ may be substantially greater than $I_{RESET}$ or it may be substantially smaller so long as the pulse width is long enough to insure that the phase-change material in the cells in which the pulse is applied crystallize. An example of a generally triangular set pulse of the type shown in FIG. 7A has a leading portion of about 50 ns and flat portion of about 200 ns and a trailing portion of about 700 ns. FIG. 7B shows two consecutive electrical cycles where each of the electrical cycles includes a hard reset pulse 200 followed by a set pulse 500.

The electrical cycles are applied to the memory element until the memory element fails. Device failure may be detected by periodically measuring the resistance of the device after a hard reset pulse is applied as well as after the subsequent set pulse is applied. Resistance measurements may be performed in a logarithmic fashion, that is, after 10 cycles, 100 cycles, 1000 cycles etc. If the device resistance after the set state is too high, this is an indication that the device is stuck in the reset state. This may be due to a failure (such as an open circuit) at the contact region after large number of cycles. Hence, this particular test is particularly well suited for detecting the "stuck reset" condition discussed above.

Test Method 3

The memory element may be tested by applying a plurality of set pulses to the memory element. Each of the set pulses is sufficient to program the memory element from its high resistance or reset state to its low resistance or set state. Preferably, each of the set pulses has an energy which is greater than the minimum energy needed to program the memory element from its high resistance or reset state to its low resistance or set state. Hence, these high energy set pulses may be referred to as "hard" set pulses. The hard set pulses are preferably applied consecutively. Generally, the hard set pulses may have any shape such a generally rectangular or generally triangular. The hard set pulses preferably have a generally triangular shape such as the shape of the set pulse 400 shown in FIG. 6A or the shape of the set pulse 500 shown in FIG. 7A. It is believed that application of a plurality of these hard set pulses may also accelerate the life of the memory element. Generally, the hard set pulses may be any form of energy. However, the hard set pulses are preferably electrical energy pulses such as current pulses. In one embodiment, it is preferred that the trailing portion of the triangular hard set pulse has a longer time period than the leading portion. An example of a triangular hard set pulse which may be used to test the memory element is a triangular set pulse having about a 1 microsecond leading portion, and 1.5 microsecond flat portion and a 9 microsecond trailing portion. It is noted that the plurality of hard set pulses do not have to be identical. However, in one embodiment of the invention all of the hard set pulses are identical.

The testing methods described herein are applicable to all programmable resistance memory elements regardless of the structure. The programmable resistance element preferably includes a programmable resistance material and at least one electrode (preferably two electrodes) that is/are electrically coupled to the programmable resistance material. The electrodes may also be referred to as electrical contacts. The methods are applicable to memory elements wherein the electrodes or electrical contacts remain stationary relative to the memory material. The methods are also applicable to memory elements wherein at least one of the electrodes or electrical contacts moves relative to the memory material (that is, an electrode or contact can move and/or the memory material can move). Hence, the test methods are applicable to a moveable probe-based technology. The test methods are also applicable to memory elements wherein at least one of the electrodes or electrical contacts is spaced apart from the memory material by, for example, a vacuum or gaseous gap, so that the electrical energy applied to the memory material is in the form of an electron beam. The testing methods are also applicable to structures wherein programming is accomplished by passing electrical energy through a resistor adjacent to the memory element (so that the thermal energy created by Joule heating within the resistor programs the memory element). An example of this type of structure is described in U.S. Pat. No. 6,448,576 which is hereby incorporated by reference herein.

The programmable resistance element is programmable to at least a first resistance state and a second resistance state. The programmable resistance element may be directly overwritable so that it can be programmed to a specific resistance state (for example, the first or the second resistance state) without the need to first be programmed to any starting state. The programmable resistance element may be a programmable resistor.

The programmable resistance element preferably comprises a memory material which is programmable to at least a first and a second resistance state. The first resistance state may be the low resistance state while the second resistance state may be the high resistance state. Preferably, the memory material is a phase-change material. The phase-change material is preferably formed from a plurality of constituent atomic elements. For example, the phase-change material may include one or more elements selected from the group consisting of Te, Se, Ge, Sb, Bi, Pb, Sn, As, S, Si, P, O and mixtures or alloys thereof. Preferably, the phase-change material includes at least one chalcogen element. Preferably, the at least one chalcogen element is selected from the group consisting of Te, Se and mixtures or alloys thereof. The at least one chalcogen element may be a mixture of Te and Se. An example of a phase-change material which may be used is $Ge_2Sb_2Te_5$.

An example of a phase-change memory material is a composition where the average concentration of Te is preferably less than about 70%, and more preferably between about 40% and about 60%. The concentration of Ge in the material is preferably greater than about 5%, more preferably between about 8% and about 50%, and most preferably between about 10% and about 44%. The remainder of the principal constituent elements is Sb. The percentages given are atomic percentages which preferably total 100% of the atoms of the constituent elements. Thus, this composition may be characterized as $Te_aGe_bSb_{100-(a+b)}$. These ternary Te—Ge—Sb alloys are useful starting materials for the development of additional phase-change materials having even better electrical characteristics.

The phase-change material may include at least one transition metal element. The term "transition metal" as used herein includes elements 21 to 30, 39 to 48, 57 and 72 to 80. Preferably, the transition metal element is selected from the group consisting of Cr, Fe, Ni, Nb, Pd, Pt and mixtures or alloys thereof. Most preferably the transition metal is Ni. Specific examples of such multi-element systems are set forth hereinafter with respect to the Te:Ge:Sb system with or without Ni and/or Se. The phase-change materials which include transition metals are elementally modified forms of the phase-change materials in the Te—Ge—Sb ternary system. That is, the elementally modified phase-change materials constitute modified forms of the Te—Ge—Sb phase-change alloys. This elemental modification is achieved by the incorporation of transition metals into the basic Te—Ge—Sb ternary system, with or without an additional chalcogen element, such as Se.

An example of an elementally modified phase-change material is a phase-change material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is preferably between about 90% and about 99.99%. The transition metal preferably include Cr, Fe, Ni, Nb, Pd, Pt and mixtures or alloys thereof.

Another example of an elementally modified phase-change material is a phase-change material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is preferably between about 90% and 99.5% and d is preferably between about 0.01% and 10%. The transition metal preferably includes Cr, Fe, Ni, Pd, Pt, Nb and mixtures or alloys thereof.

The memory element includes means for applying the energy to the volume of memory material. When the energy is electrical energy, the memory element may include electrical contacts for supplying the voltage or current to the volume of memory material. The shape of the contacts as well as their positioning relative to the volume of memory material may be varied to form different device structures. As an example, the electrical contacts may include first and second contacts positioned adjacent to the memory material. An example of a memory element design is provided in U.S. patent application Ser. No. 09/276,273, the disclosure of which is incorporated herein by reference.

A characteristic of electrical memory devices, is its resistance to dosages of radiation. This is referred to as the "radiation hardness" of the device. In particular, radiation penetrating semiconductor materials such as silicon and silicon oxides may be affected by doses of radiation. For example, the radiation generates mobile electrons and holes in the silicon oxide. The holes are quickly trapped and immobilized near the interface of the silicon oxide and silicon where their charges change the electrical characteristics of the device.

Various techniques have been developed for forming or treating the silicon oxide so as to improve the radiation hardness of the device. Preferably, the memory system of the present invention are preferably adapted to be "radiation hard", that is, resistant to radiation.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A method of operating an electrically programmable, phase-change memory element, said memory element having a plurality of resistance states, said plurality including a low resistance state and a reset state, said method comprising the steps of:

provided said memory element;

programming said memory element to said low resistance state; and applying a hard reset pulse to said memory element, said hard reset pulse providing energy to said memory element in an amount exceeding the energy difference between said reset state and said low resistance state;

wherein said applying hard reset pulse step is repeatedly applied until said memory element fails.

2. The method of claim 1, wherein said hard reset pulse is an electrical pulse.

3. The method of claim 1, wherein said hard reset pulse is a current pulse.

4. The method of claim 1, where said hard reset pulse is generally rectangular.

5. The method of claim 1, wherein said memory element comprises a chalcogen element.

6. The method of claim 1, wherein said memory element comprises a programmable resistance material and at least one electrode electrically coupled to said programmable resistance material.

7. The method of claim 1, wherein the energy of said hard reset pulse is at least 10 times greater than the minimum energy needed to program said memory element from said low resistance state to said reset state.

8. The method of claim 1, wherein said method includes two or more of said applying hard reset pulse steps.

9. The method of claim 8, wherein said two or more hard reset pulses have the same energy.

10. The method of claim 8, wherein each of said applying hard reset pulse steps is followed by the step of applying a set pulse to said memory device.

11. The method of claim 1, wherein said hard reset pulse is generally triangular.

12. The method of claim 1, wherein said memory element fails in a stuck reset condition.

13. The method of claim 1, wherein said memory element fails in a stuck set condition.

14. The method of claim 1, wherein said memory element fails due to inability of current to pass through the device.

15. The method of claim 1, wherein the number of applications of said hard reset pulse required to cause said memory element to fail is fewer than the number of applications of a pulse providing an energy equal to the energy difference between said reset state and said low resistance state that would be required to cause said memory element to fail.

16. The method of claim 1, wherein said low resistance state is the set state of said memory element.

17. The method of claim 1, further comprising the step of setting said memory element.

18. The method of claim 17, wherein said setting step of setting said memory element includes applying energy to the memory element so that a material of the memory element substantially crystallizes.

19. The method of claim 17, wherein said setting step is performed after said applying hard reset pulse step.

20. The method of claim 5, wherein said chalcogen element is Te.

21. The method of claim 5, wherein said memory element further comprises Ge.

* * * * *